US008829650B2

United States Patent
Liu et al.

(10) Patent No.: US 8,829,650 B2
(45) Date of Patent: Sep. 9, 2014

(54) ZENER DIODE IN A SIGE BICMOS PROCESS AND METHOD OF FABRICATING THE SAME

(71) Applicant: Shanghai Hua Hong Nec Electronics Co., Ltd., Shanghai (CN)

(72) Inventors: Donghua Liu, Shanghai (CN); Jun Hu, Shanghai (CN); Wenting Duan, Shanghai (CN); Wensheng Qian, Shanghai (CN); Jing Shi, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 18 days.

(21) Appl. No.: 13/734,464

(22) Filed: Jan. 4, 2013

(65) Prior Publication Data
US 2013/0175581 A1    Jul. 11, 2013

(30) Foreign Application Priority Data
Jan. 6, 2012    (CN) .......................... 2012 1 0004113

(51) Int. Cl.
| | | |
|---|---|---|
| *H01L 29/866* | (2006.01) | |
| *H01L 29/66* | (2006.01) | |
| *H01L 21/82* | (2006.01) | |
| *H01L 27/04* | (2006.01) | |
| *H01L 27/06* | (2006.01) | |
| *H01L 21/8249* | (2006.01) | |
| *H01L 29/737* | (2006.01) | |
| *H01L 27/08* | (2006.01) | |
| *H01L 29/161* | (2006.01) | |

(52) U.S. Cl.
CPC .......... *H01L 21/82* (2013.01); *H01L 29/66106* (2013.01); *H01L 27/0635* (2013.01); *H01L 29/866* (2013.01); *H01L 21/8249* (2013.01); *H01L 29/7378* (2013.01); *H01L 27/0814* (2013.01); *H01L 27/04* (2013.01); *H01L 29/161* (2013.01)
USPC .... 257/603; 257/199; 257/378; 257/E29.335; 438/380; 438/237

(58) Field of Classification Search
USPC ......... 257/197, 199, 175, 378, 379, 577, 603, 257/E29.335; 438/318, 328, 237, 380
See application file for complete search history.

(56) References Cited

U.S. PATENT DOCUMENTS

2012/0049319 A1* 3/2012 Qian et al. ................... 257/526

* cited by examiner

*Primary Examiner* — Matthew W Such
*Assistant Examiner* — Scott Stowe
(74) *Attorney, Agent, or Firm* — MKG, LLC

(57) ABSTRACT

A zener diode in a SiGe BiCMOS process is disclosed. An N-type region of the zener diode is formed in an active region and surrounded by an N-deep well. A pseudo buried layer is formed under each of the shallow trench field oxide regions on a corresponding side of the active region, and the N-type region is connected to the pseudo buried layers via the N-deep well. The N-type region has its electrode picked up by deep hole contacts. A P-type region of the zener diode is formed of a P-type ion implanted region in the active region. The P-type region is situated above and in contact with the N-type region, and has a doping concentration greater than that of the N-type region. The P-type region has its electrode picked up by metal contact. A method of fabricating zener diode in a SiGe BiCMOS process is also disclosed.

9 Claims, 3 Drawing Sheets

ZENER DIODE IN A SIGE BICMOS PROCESS AND METHOD OF FABRICATING THE SAME

CROSS-REFERENCE TO RELATED APPLICATION

This application claims the priority of Chinese patent application number 201210004113.X, filed on Jan. 6, 2012, the entire contents of which are incorporated herein by reference.

TECHNICAL FIELD

The present invention relates to the fabrication of semiconductor integrated circuits, and more particularly, to a zener diode in a silicon-germanium (SiGe) bipolar complementary metal oxide semiconductor (BiCMOS) process. Moreover, this invention also relates to a method of fabricating zener diode in a SiGe BiCMOS process.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are well compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

A zener diode is a diode whose operation relies on the voltage regulation characteristic of its PN junction's breakdown region. A zener diode is also called a voltage regulator diode, so as to be distinguished from those for unilateral conduction used in current regulation, detection and other applications. Thanks to the feature of a zener diode that the voltage across it remains substantially unchanged after it is broken down, when a zener diode is connected in a circuit, the voltage across the load can remain substantially unchanged even when the voltages at other nodes of the circuit are changed due to the power source voltage fluctuations or other reasons. When a zener diode is broken down in the reverse direction, though the current flows therein will undergo a great change, the voltage across the zener diode will change slightly. Because of such electrical characteristic, a zener diode plays a role of voltage regulation in a circuit and is mainly used as a voltage regulator or voltage reference element. Several zener diodes connected in series can produce a higher constant voltage to meet demand in high voltage applications.

SUMMARY OF THE INVENTION

The present invention is directed to provide a zener diode which can be completely integrated in a silicon-germanium (SiGe) bipolar complementary metal oxide semiconductor (BiCMOS) process and can serve as a voltage regulation device in SiGe BiCMOS circuits. The present invention also provides a method of fabricating the zener diode.

To achieve the above objective, the zener diode in a SiGe BiCMOS process provided by the present invention is formed on a silicon substrate and the silicon substrate has an active region isolated by shallow trench field oxide regions. The zener diode includes:

an N-deep well in the active region, the N-deep well having a depth greater than that of the shallow trench field oxide regions, the N-deep well having a lateral extending portion on each side of the active region, the lateral extending portion being situated under a corresponding shallow trench field oxide region;

an N-type region formed of an N-type ion implanted region in the active region, the N-type region having a lateral dimension equal to or smaller than that of the active region and being surrounded by the N-deep well;

pseudo buried layers, each being formed of an N-type ion implanted region under a corresponding shallow trench field oxide region on a corresponding side of the active region, each of the pseudo buried layers being in contact with a corresponding lateral extending portion of the N-deep well, the N-type region being connected to the respective pseudo buried layers via the N-deep well;

deep hole contacts for picking up electrodes of the N-type region, each of the deep hole contacts being formed in a corresponding shallow trench field oxide region above the corresponding pseudo buried layer;

a P-type region formed of a P-type ion implanted region in the active region, the P-type region being situated above and in contact with the N-type region, the P-type region having a doping concentration greater than that of the N-type region; and a metal contact for picking up an electrode of the P-type region, the metal contact being formed above the active region and in contact with the P-type region.

In one embodiment, the N-type region is formed in a same manner by which a collector region of a SiGe heterojunction bipolar transistor (HBT) is formed.

In another embodiment, the P-type region is formed in a same manner by which a source/drain implantation region of a p-type metal-oxide-semiconductor (PMOS) transistor is formed.

To achieve the above objective, the method of fabricating zener diode in a silicon-germanium (SiGe) bipolar complementary metal oxide semiconductor (BiCMOS) process provided by the present invention includes the steps of:

forming shallow trenches and an active region in a silicon substrate;

forming pseudo buried layers by implanting N-type ions into bottoms of the respective shallow trenches;

forming shallow trench field oxide regions by filling the respective shallow trenches with a dielectric material;

forming an N-deep well in the active region by an ion implantation process, the N-deep well having a depth greater than that of the shallow trench field oxide regions, the N-deep well having a lateral extending portion on each side of the active region, each of the pseudo buried layers being in contact with a corresponding lateral extending portion of the N-deep well;

forming an N-type region by implanting N-type ions into the active region, the N-type region having a lateral dimension equal to or smaller than that of the active region and being surrounded by the N-deep well, the N-type region being connected to the respective pseudo buried layers via the N-deep well;

forming a P-type region by implanting P-type ions into the active region, the P-type region being situated above and in contact with the N-type region, the P-type region having a doping concentration greater than that of the N-type region;

forming deep hole contacts for picking up electrodes of the N-type region, each of the deep hole contacts being formed in a corresponding shallow trench field oxide region above the corresponding pseudo buried layer; and forming a metal contact for picking up an electrode of the P-type region, the metal contact being formed above the active region and in contact with the P-type region.

In an embodiment, phosphorus ions are implanted with a dose of 1e14 cm$^{-2}$ to 1e16 cm$^{-2}$ and an energy of 2 KeV to 50 KeV to form the pseudo buried layers.

In an embodiment, the N-type region is form by using a same N-type ion implantation process by which a collector region of a SiGe HBT is formed.

In an embodiment, the N-type ion implantation process is performed by using phosphorus as impurity ions with a dose of 2e12 cm$^{-2}$ to 5e14 cm$^{-2}$ and an energy of 30 KeV to 350 KeV.

In an embodiment, the P-type region is formed by using a same P-type ion implantation process by which a source/drain implantation region of a PMOS transistor is formed.

In an embodiment, phosphorus ions are implanted with a dose of 2e12 cm$^{-2}$ to 1e14 cm$^{-2}$ and an energy of 1500 KeV to 2000 KeV to form the N-deep well.

Of the zener diode according to the present invention, as the N-type region can be formed in a same manner by which a collector region of a SiGe HBT is formed and the P-type region is formed in a same manner by which a source/drain implantation region of a PMOS transistor is formed, the zener diode can be completely integrated into a SiGe BiCMOS process, thereby providing a voltage regulation device for SiGe BiCMOS circuit design.

BRIEF DESCRIPTION OF THE DRAWINGS

The present invention will be described and specified below with reference to accompanying drawings and specific embodiments.

DETAILED DESCRIPTION

Figure 1:
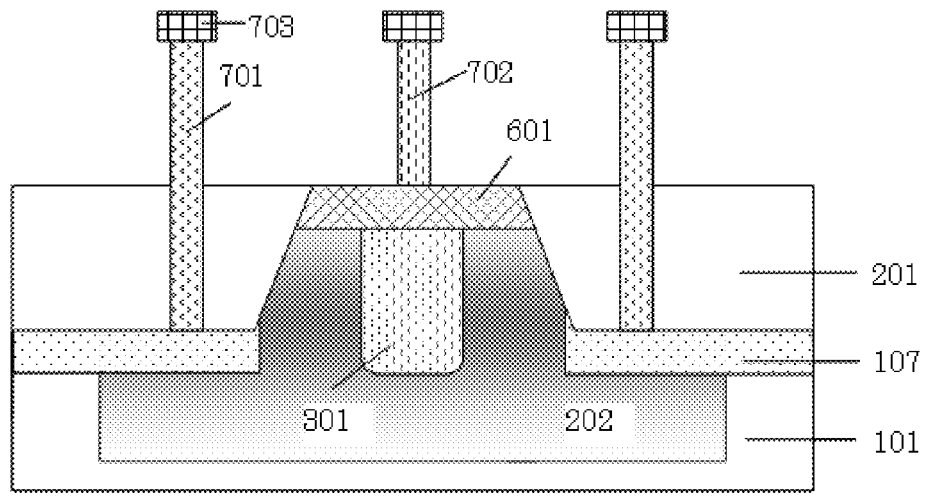
FIG. 1 is a schematic diagram illustrating a zener diode in a SiGe BiCMOS process constructed according to an embodiment of the present invention.

FIG. 1 is a schematic diagram illustrating a zener diode in a SiGe BiCMOS process constructed according to an embodiment of the present invention. The zener diode of this embodiment is formed on a silicon substrate 101, in which an active region is isolated by shallow trench field oxide regions 201. The zener diode includes:

an N-deep well 202 having an inverted T-shape formed in the active region, wherein the N-deep well 202 has a depth greater than that of the shallow trench field oxide regions 201 and has a lateral extending portion on each side of the active region, the lateral extending portion being situated under the corresponding shallow trench field oxide region 201;

an N-type region 301 formed of an N-type ion implanted region in the active region, wherein the N-type region 301 is formed in a same manner by which a collector region of a SiGe heterojunction bipolar transistor (HBT) is formed; the N-type region 301 has a lateral dimension (i.e. width) equal to or smaller than that of the active region and is surrounded by the N-deep well 202;

pseudo buried layers 107 formed of respective N-type ion implanted regions, each of which is formed under the corresponding shallow trench field oxide region 201 on the corresponding side of the active region; each of the pseudo buried layers 107 is in contact with a corresponding lateral extending portion of the N-deep well 202, so that the N-type region 301 is connected to the respective pseudo buried layers 107 via the N-deep well 202; deep hole contacts 701 for picking up electrodes of the N-type region 301 are formed in the respective shallow trench field oxide regions 201 above the respective pseudo buried layers 107;

a P-type region 601 formed of a P-type ion implanted region in the active region, wherein the P-type region 601 is formed in a same manner by which a source/drain implantation region of a P-type metal-oxide-semiconductor (PMOS) transistor is formed; the P-type region is situated above and in contact with the N-type region 301; the P-type region 601 has a doping concentration greater than that of the N-type region 301; a metal contact 702 for picking up an electrode of the P-type region 601 is formed above the active region and the metal contact 702 is in contact with the P-type region 601; and a metal layer 703 is formed on top of the device to enable the device to be interconnected with other devices.

FIGS. 2A to 2F are schematic diagrams depicting structures of a device after respective steps of a method of fabricating zener diode in a SiGe BiCMOS process according to an embodiment of the present invention. The method of this embodiment includes the following steps.

Figure 2A:
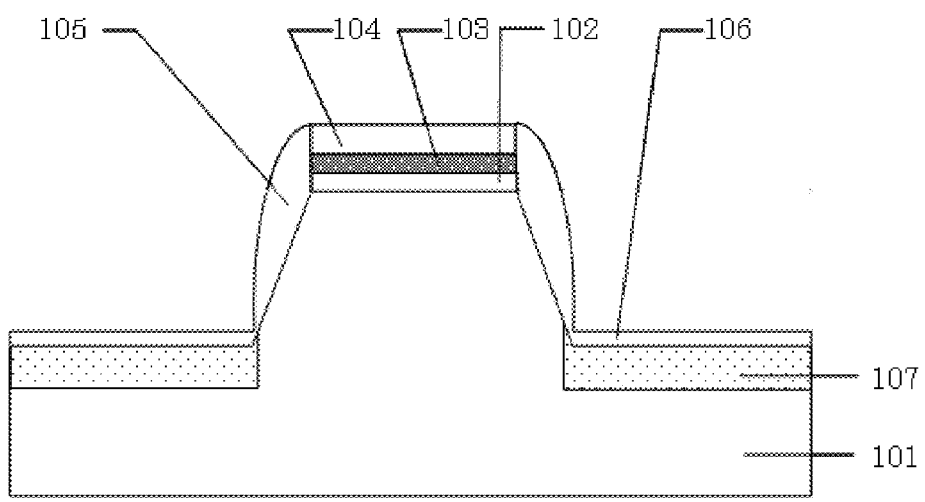
FIGS. 2A to 2F are schematic diagrams depicting structures of a device after respective steps of a method of fabricating zener diode in a SiGe BiCMOS process according to an embodiment of the present invention.

In a first step, as shown in FIG. 2A, first, a lithographic and etching process is performed to a P-silicon substrate 101 to form shallow trenches and an active region therein. During the above process, the region above the active region is protected by a hard mask layer which includes, from bottom up, an oxide layer 102, a nitride layer 103 and another oxide layer 104.

Next, still referring to FIG. 2A, after the shallow trenches have been formed, an oxide layer is deposited and etched to form oxide sidewalls 105 on respective inner side faces of each shallow trench, while leaving an oxide layer 106 on bottom surface of each shallow trench.

In a second step, as shown in FIG. 2A, an N-type ion implantation process is performed to the bottoms of the respective shallow trenches on the respective sides of the active region to form pseudo buried layers 107, wherein N-type phosphorus ions are implanted with a dose of 1e14 cm$^{-2}$ to 1e16 cm$^{-2}$ and an energy of 2 KeV to 50 KeV to form the pseudo buried layers 107.

Figure 2B:
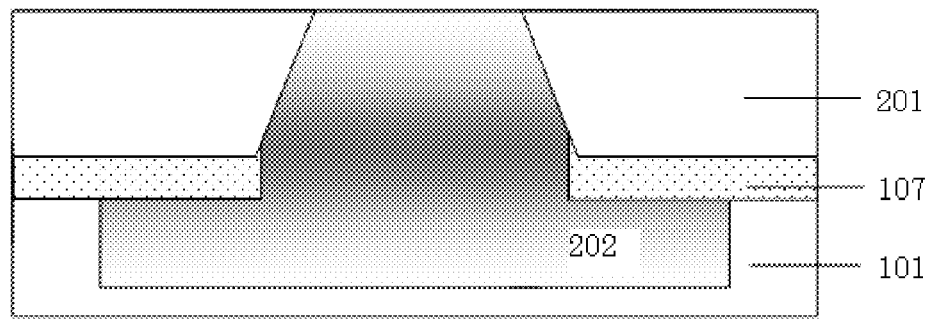

In a third step, as shown in FIG. 2B, a dielectric material, e.g. silicon oxide, is filled in the shallow trenches to form shallow trench field oxide regions 201.

As shown in FIG. 2B, phosphorus ions are implanted into the substrate 101 with a dose of 2e12 cm$^{-2}$ to 1e14 cm$^{-2}$ and an energy of 1500 KeV to 2000 KeV to form an N-deep well 202 which has a depth greater than that of the shallow trench field oxide regions 201 and has lateral extending portions under the respective shallow trench field oxide regions 201 on the respective sides of the active region. The pseudo buried layers 107 are in contact with the lateral extending portions of the N-deep well 202 under the respective shallow trench field oxide 201 regions.

Figure 2C:
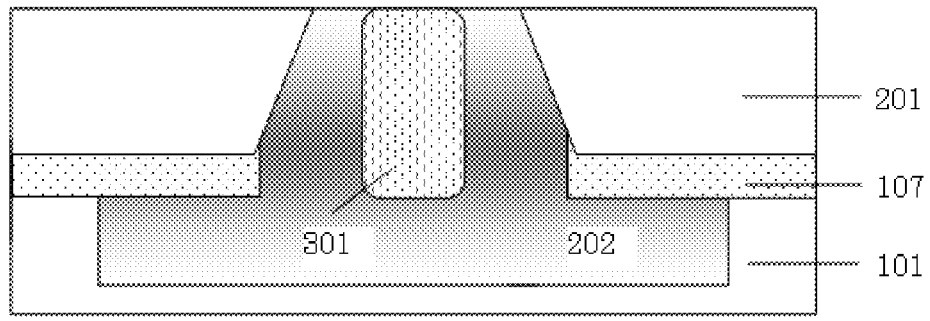

In a fourth step, as shown in FIG. 2C, an N-type ion implantation process is performed to the active region to form an N-type region 301 which is surrounded by the N-deep well 202 and has a lateral dimension equal to or smaller than that of the active region. The N-type region 301 is connected to the pseudo buried layers 107 via the N-deep well 202. The N-type region 301 is formed in a same manner by which a collector region of a SiGe HBT is formed, wherein phosphorus ions are implanted with a dose of 2e12 cm$^{-2}$ to 5e14 cm$^{-2}$ and an energy of 30 KeV to 350 KeV.

Figure 2D:
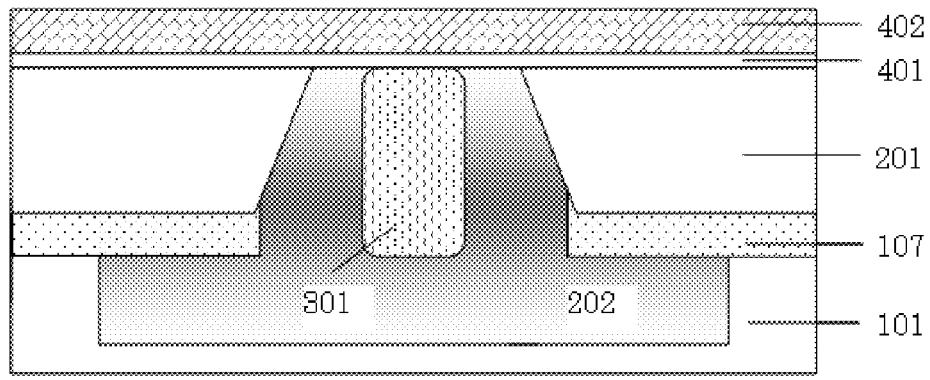
Figure 2E:
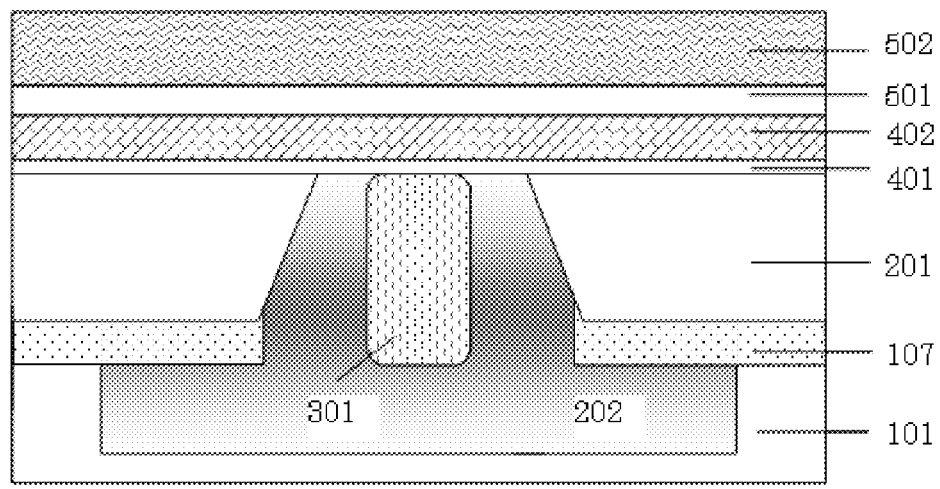
Figure 2F:
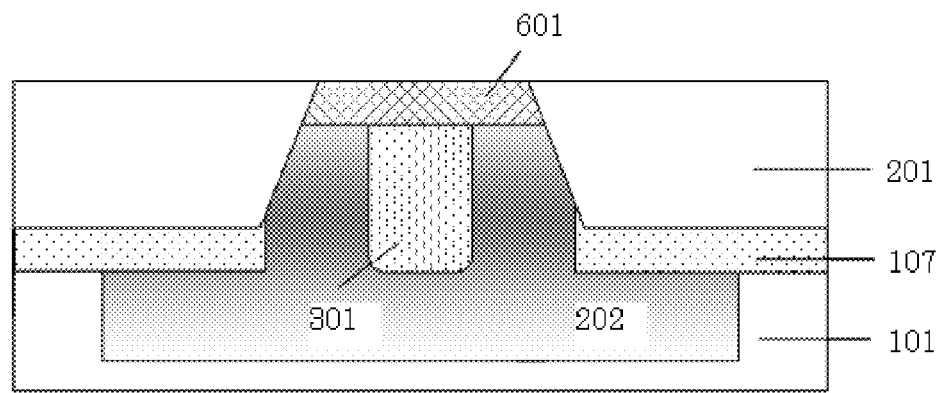

In some embodiment of the present invention, there is provided a method which enables a zener diode of the present invention to be formed concurrent with the formation of a SiGe HBT device and a complementary metal oxide semiconductor (CMOS) device on an identical silicon substrate 101. In such embodiment, in addition to the above first to fourth steps (among which, the fourth step is for simultaneously forming the N-type region 301 of the zener diode and a collector region of the SiGe HBT device), the method also includes the following steps:

as shown in FIG. 2D, depositing a first oxide dielectric layer 401 over the surface of the silicon substrate 101 and forming a base window (not shown) in the first oxide dielectric layer 401; a base region of the SiGe HBT device is to be formed in the base window;

depositing a SiGe epitaxial layer 402 over the surface of the silicon substrate 101 to form a base region (not shown) of the SiGe HBT device in the base window;

as shown in FIG. 2E, depositing a second oxide dielectric layer 501 over the surface of the silicon substrate 101 and forming an emitter window (not shown) in the second oxide dielectric layer 501; an emitter region of the SiGe HBT device is to be formed in the emitter window;

depositing a polysilicon layer 502 over the surface of the silicon substrate 101 to form an emitter region (not shown) of the SiGe HBT device in the emitter window; and as shown in FIG. 2F, finally, removing portions of the first oxide dielectric layer 401, the SiGe epitaxial layer 402, the second oxide dielectric layer 501 and the polysilicon layer 502 above the zener diode.

In a fifth step, as shown in FIG. 2F, a P-type ion implantation process is performed to the active region to form a P-type region 601 which is situated above and in contact with the N-type region 301 and the P-type region 601 has a doping concentration greater than that of the N-type region 301, wherein the P-type region 601 is formed in a same manner by which a source/drain implantation region of a PMOS transistor is formed, i.e., the P-type region 601 may be formed concurrent with the formation of a source/drain implantation region of a PMOS transistor which is a type of CMOS device.

In a sixth step, as shown in FIG. 1, a deep hole contact 701 is formed in each of the shallow trench field oxide regions 201 above a corresponding pseudo buried layer 107 to pick up an electrode of the N-type region 301 and a metal contact 702 is formed above the active region and in contact with the P-type region 601 to pick up an electrode of the P-type region 601. At last, a metal layer 703 is formed on top of the device to enable the device to be interconnected with other devices.

While specific embodiments have been presented in the foregoing description of the invention, they are not intended to limit the invention in any way. Those skilled in the art can make various modifications and variations without departing from the spirit or scope of the invention. Thus, it is intended that the present invention covers all such modifications and variations.

What is claimed is:

1. A zener diode in a silicon-germanium (SiGe) bipolar complementary metal oxide semiconductor (BiCMOS) process, the zener diode being formed on a silicon substrate having an active region isolated by shallow trench field oxide regions, the zener diode comprising:

an N-deep well in the active region, the N-deep well having a depth greater than that of the shallow trench field oxide regions, the N-deep well having a lateral extending portion on each side of the active region, the lateral extending portion being situated under a corresponding shallow trench field oxide region;

an N-type region formed of an N-type ion implanted region in the active region, the N-type region having a lateral dimension equal to or smaller than that of the active region and being surrounded by the N-deep well;

pseudo buried layers, each being formed of an N-type ion implanted region under a corresponding shallow trench field oxide region on a corresponding side of the active region, each of the pseudo buried layers being in contact with a corresponding lateral extending portion of the N-deep well, the N-type region being connected to the respective pseudo buried layers via the N-deep well;

deep hole contacts formed in a corresponding shallow trench field oxide region above a corresponding pseudo buried layer;

a P-type region formed of a P-type ion implanted region in the active region, the P-type region being situated above and in contact with the N-type region, the P-type region having a doping concentration greater than that of the N-type region; and a metal contact formed above the active region and in contact with the P-type region.

2. The zener diode according to claim 1, wherein the N-type region is formed in a same manner by which a collector region of a SiGe heterojunction bipolar transistor is formed.

3. The zener diode according to claim 1, wherein the P-type region is formed in a same manner by which a source/drain implantation region of a PMOS transistor is formed.

4. A method of fabricating zener diode in a SiGe BiCMOS process, the method comprising the steps of:

forming shallow trenches and an active region in a silicon substrate;

forming pseudo buried layers by implanting N-type ions into bottoms of the respective shallow trenches;

forming shallow trench field oxide regions by filling the respective shallow trenches with a dielectric material;

forming an N-deep well in the active region by an ion implantation process, the N-deep well having a depth greater than that of the shallow trench field oxide regions, the N-deep well having a lateral extending portion on each side of the active region, each of the pseudo buried layers being in contact with a corresponding lateral extending portion of the N-deep well;

forming an N-type region by implanting N-type ions into the active region, the N-type region having a lateral dimension equal to or smaller than that of the active region and being surrounded by the N-deep well, the N-type region being connected to the respective pseudo buried layers via the N-deep well;

forming a P-type region by implanting P-type ions into the active region, the P-type region being situated above and in contact with the N-type region, the P-type region having a doping concentration greater than that of the N-type region;

forming deep hole in a corresponding shallow trench field oxide region above a corresponding pseudo buried layer; and forming a metal contact above the active region and in contact with the P-type region.

5. The method according to claim 4, wherein the pseudo buried layers are form by implanting phosphorus ions into the bottoms of the respective shallow trenches with a dose of $1e14\ cm^{-2}$ to $1e16\ cm^{-2}$ and an energy of 2 KeV to 50 KeV.

6. The method according to claim 4, wherein the N-type region is form by using a same N-type ion implantation process by which a collector region of a SiGe HBT is formed.

7. The method according to claim 6, wherein the N-type ion implantation process is performed by using phosphorus as impurity with a dose of $2e12\ cm^{-2}$ to $5e14\ cm^{-2}$ and an energy of 30 KeV to 350 KeV.

8. The method according to claim 4, wherein the P-type region is formed by using a same P-type ion implantation process by which a source/drain implantation region of a PMOS transistor is formed.

9. The method according to claim 4, wherein the N-deep well is form by a phosphorus ions implantation process with a dose of $2e12\ cm^{-2}$ to $1e14\ cm^{-2}$ and an energy of 1500 KeV to 2000 KeV.

* * * * *